(12) United States Patent
Brandyberry et al.

(10) Patent No.: US 7,478,299 B2
(45) Date of Patent: Jan. 13, 2009

(54) PROCESSOR FAULT ISOLATION

(75) Inventors: Mark A. Brandyberry, Austin, TX (US); Lee H. Wilson, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 331 days.

(21) Appl. No.: 11/464,393

(22) Filed: Aug. 14, 2006

(65) Prior Publication Data

US 2008/0052576 A1 Feb. 28, 2008

(51) Int. Cl.
*G01R 31/28* (2006.01)
*G06F 11/00* (2006.01)

(52) U.S. Cl. .......................... 714/727; 714/30; 714/47
(58) Field of Classification Search .................. None
See application file for complete search history.

(56) References Cited

U.S. PATENT DOCUMENTS

| | | | |
|---|---|---|---|
| 5,168,499 A | 12/1992 | Peterson et al. | |
| 5,485,604 A | 1/1996 | Miyoshi et al. | |
| 5,663,950 A | 9/1997 | Lee et al. | |
| 6,052,796 A | 4/2000 | Croslin | |
| 6,073,254 A | 6/2000 | Whetsel | |
| 6,102,963 A | 8/2000 | Agrawal | |
| 6,260,076 B1 | 7/2001 | Savitzky et al. | |
| 6,347,074 B1 | 2/2002 | Croslin et al. | |
| 6,622,262 B1* | 9/2003 | Nagoya | 714/13 |
| 6,857,033 B1 | 2/2005 | Gulick et al. | |
| 6,983,405 B1* | 1/2006 | Herron et al. | 714/726 |
| 2005/0276214 A1 | 12/2005 | Phelan et al. | |

FOREIGN PATENT DOCUMENTS

| EP | 0735478 A1 | 10/1996 |
|---|---|---|
| JP | 2001282758 A | 10/2001 |

* cited by examiner

*Primary Examiner*—Christine T Tu
(74) *Attorney, Agent, or Firm*—John Biggers; Cindy S. Byrd; Biggers & Ohanian, LLP

(57) ABSTRACT

Methods, apparatus, and products for processor fault isolation are disclosed that include sending, by an embedded system microcontroller to a programmable logic device ('PLD') a selection signal identifying one processor for boundary scan operations; sending boundary scan input signals to be sent to the identified processor; multiplexing by the PLD the boundary scan input signals to the identified processor; and sending boundary scan output signals returned from the identified processor. Methods, apparatus, and products for processor fault isolation are also disclosed that include connecting two or more processors in a boundary scan test chain, the connecting carried out by a PLD of a computer, the PLD further connected to sense lines carrying presence signals indicating whether processors are present in the computer; and including in the chain all processors indicated present according to presence signals.

20 Claims, 6 Drawing Sheets

Send, In A Computer That Includes More Than One Processor Connected For Boundary Scan Operations To A Programmable Logic Device ('PLD'), By An Embedded System Microcontroller To The PLD At Least One Selection Signal Identifying One Processor For Boundary Scan Operations
502

Send, By The Embedded System Microcontroller To The PLD, Boundary Scan Input Signals To Be Sent To The Identified Processor
504

Multiplex By The PLD The Boundary Scan Input Signals To The Identified Processor
506

Send, By The PLD To The Embedded System Microcontroller, Boundary Scan Output Signals Returned From The Identified Processor
508

FIG. 5

PROCESSOR FAULT ISOLATION

BACKGROUND OF THE INVENTION

1. Field of the Invention

The field of the invention is data processing, or, more specifically, methods, systems, and products for processor fault isolation.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas that has seen considerable advancement is multiprocessing, using more than one processor in a single computer. In such system, detecting faults in a single processor is a challenge. When a processor fails, it may not respond to in-band interrogation, normal processor commands presented through a main bus or a front side bus. One method of fault isolation therefore is to interrogate a processor out-of-band, through a JTAG port on the processor, for example. 'JTAG' is an acronym for Joint Test Action Group and is the name usually used to refer to the IEEE 1149.1 standard entitled Standard Test Access Port and Boundary-Scan Architecture. JTAG is a standard for test access ports used for testing printed circuit boards and components (including computer processors) using boundary scan. Boundary scan is a method for testing interconnects (thin wire lines) on printed circuit boards or sub-blocks inside of an integrated circuit. The boundary scan standard referred to as JTAG has been so widely adopted by electronic device companies all over the work that today 'boundary scan' and 'JTAG' are practically synonyms. In this specification, however, 'boundary scan' and 'JTAG' are not treated as synonyms. 'Boundary scan' as the term is used here refers to boundary scan operations generally, while 'JTAG' is used to refer to boundary scans according to the JTAG standard. That is, in this specification, JTAG is treated as an example of one kind of boundary scan, admittedly as widely used example, but nevertheless, just one example. The term 'boundary scan' includes not only JTAG, but also any kind of boundary scan that may occur to those of skill in the art.

The boundary scan architecture provides a means to test interconnects and clusters of logic, memories, and other circuit elements without using physical test probes. It adds one or more so called 'test cells' connected to each pin of a device that can selectively override the functionality of that pin. These cells can be programmed through a JTAG scan chain to drive a signal onto a pin and across an individual trace on the board. The cell at the destination of the board trace can then be programmed to read the value at the pin, verifying the board trace properly connects the two pins. If the trace is shorted to another signal or if the trace has been cut, the correct signal value will not show up at the destination pin, and the board will be known to have a fault.

When performing boundary scan inside integrated circuits, boundary scan latch cells, sometimes called 'test cells' or 'latch cells' or just 'latches,' are added between logical design blocks in order to be able to control them in the same manner as if they were physically independent circuits. For normal operation, the added boundary scan latch cells are set so that they have no effect on the circuit, and are therefore effectively invisible. Then when the circuit is set into a test mode, the latches enable a data stream to be passed from one latch to the next, serially, in a so-called 'scan chain.' As the cells can be used to force data into the board, they can set up test conditions. The relevant states can then be fed back into an external test system by clocking the data word back serially so that it can be analyzed.

By adopting this technique, it is possible for a test system to gain test access to a board or to internal logic in an integrated circuit such as a computer processor or computer memory module. As most of today's boards are very densely populated with components and tracks, it is very difficult for test systems to access the relevant areas of the board to enable them to test the board. Moreover, most of the internal logic within an integrated circuit is not externally connected through pins or pads so that an external test system can access them at all. Boundary scan makes these things possible.

During product development, a JTAG port is normally connected to an external test system, such as, for example, AMD's Hardware Debug Tool or an American Arium, to read processor registers and control processor operations for test. In this configuration, all processors installed in the computer under test are in a single JTAG chain. In order to communicate with a specific processor, all others in the chain need to be placed in BYPASS mode to allow JTAG commands to pass through them. While his method is fine for code development, it poses challenges when using the processor's JTAG port for fault isolation purposes. One problem is that if a single processor's fault is catastrophic enough to render its JTAG port inoperable, the chain is broken. This would prevent communication with other processors in the chain which may still be viable and may hold clues to what went wrong.

Another problem is that placing a processor in BYPASS mode typically is an operation effected out-of-band through a microcontroller, such as for example a Baseboard Management Controller ('BMC'). A BMC is a specialized microcontroller embedded on the motherboard of many computers, especially servers. The BMC is the intelligence in the Intelligent Platform Management Interface ('IPMI') architecture. The BMC manages the interface between system management software and platform hardware.

Different types of sensors built into the computer system report to the BMC on parameters such as temperature, cooling fan speeds, power mode, operating system status, processor operations, and so on. The BMC monitors the sensors and can send alerts to a system administrator via the network if any of the parameters do not stay within preset limits, indicating a potential failure of the system. The administrator can also remotely communicate with the BMC to take some corrective action such as resetting or power cycling the system to get a hung operating system running again. These abilities save on the total cost of ownership of a system.

Physical interfaces to the BMC include System Management Buses ('SMBs'), an RS-232 bus, address and data lines and an Intelligent Platform Management Bus ('IPMB'), that enables the BMC to accept IPMI request messages from other management controllers in the system. The BMC communicates with a BMC management utility ('BMU') on a remote client using IPMI protocols. The BMU is usually a command line interface ('CLI') application. The Intelligent Platform Management Interface (IPMI) specification defines a set of common interfaces to computer hardware and firmware which system administrators can utilize to monitor system health and manage the system.

IPMI operates independently of the operating system and allows administrators to manage a system remotely even in the absence of the operating system or the system management software, or even if the monitored system has not powered on. IPMI can also function when the operating system has started, and offers enhanced features when used with the system management software. IPMI enables sending out alerts via a direct serial connection, a local area network ('LAN') or a serial over LAN ('SOL') connection to a remote client. System administrators can then use IPMI messaging to query platform status, to review hardware logs, or to issue other requests from a remote console through the same connections. The standard also defines an alerting mechanism for the system to send a simple network management protocol ('SNMP') platform event trap ('PET').

System management microcontrollers such as BMCs are small embedded devices that contain a small processor, a small quantity of memory in which is stored a microcontroller control program, and one or more I/O ports. The mechanics of putting a processor in BYPASS mode represents a large operational burden on such an embedded microcontroller. It is a benefit therefore that the microcontroller program code required for such a microcontroller to interrogate processors and isolate faults is kept as simple and streamlined as possible.

In addition, when an external device is using the JTAG chain or debug/development purposes, processors are normally included or excluded from the chain via on-board mechanical switches or jumpers. This requires manual chain configuration or reconfiguration if the number or position of processors in the system is changed.

SUMMARY OF THE INVENTION

Methods, apparatus, and products for processor fault isolation are disclosed that include sending, by an embedded system microcontroller to a programmable logic device ('PLD') a selection signal identifying one processor for boundary scan operations; sending boundary scan input signals to be sent to the identified processor; multiplexing by the PLD the boundary scan input signals to the identified processor; and sending boundary scan output signals returned from the identified processor. Methods, apparatus, and products for processor fault isolation are also disclosed that include connecting two or more processors in a boundary scan test chain, the connecting carried out by a PLD of a computer, the PLD further connected to sense lines carrying presence signals indicating whether processors are present in the computer; and including in the chain all processors indicated present according to presence signals.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 5 sets forth a flow chart illustrating an exemplary method of processor fault isolation according to embodiments of the present invention.

DETAILED DESCRIPTION OF EXEMPLARY EMBODIMENTS

Exemplary methods, systems, and products for processor fault isolation according to embodiments of the present invention are described with reference to the accompanying drawings, beginning with FIG. 1. 'Processor fault isolation,' as the term is used in this specification, refers to determining the cause of a problem with a processor. The term includes methods that can isolate a source of a problem to a processor or to a component or logic circuit or even a particular register within a processor. Such methods can include boundary scan operations to isolate faults.

Figure 1:
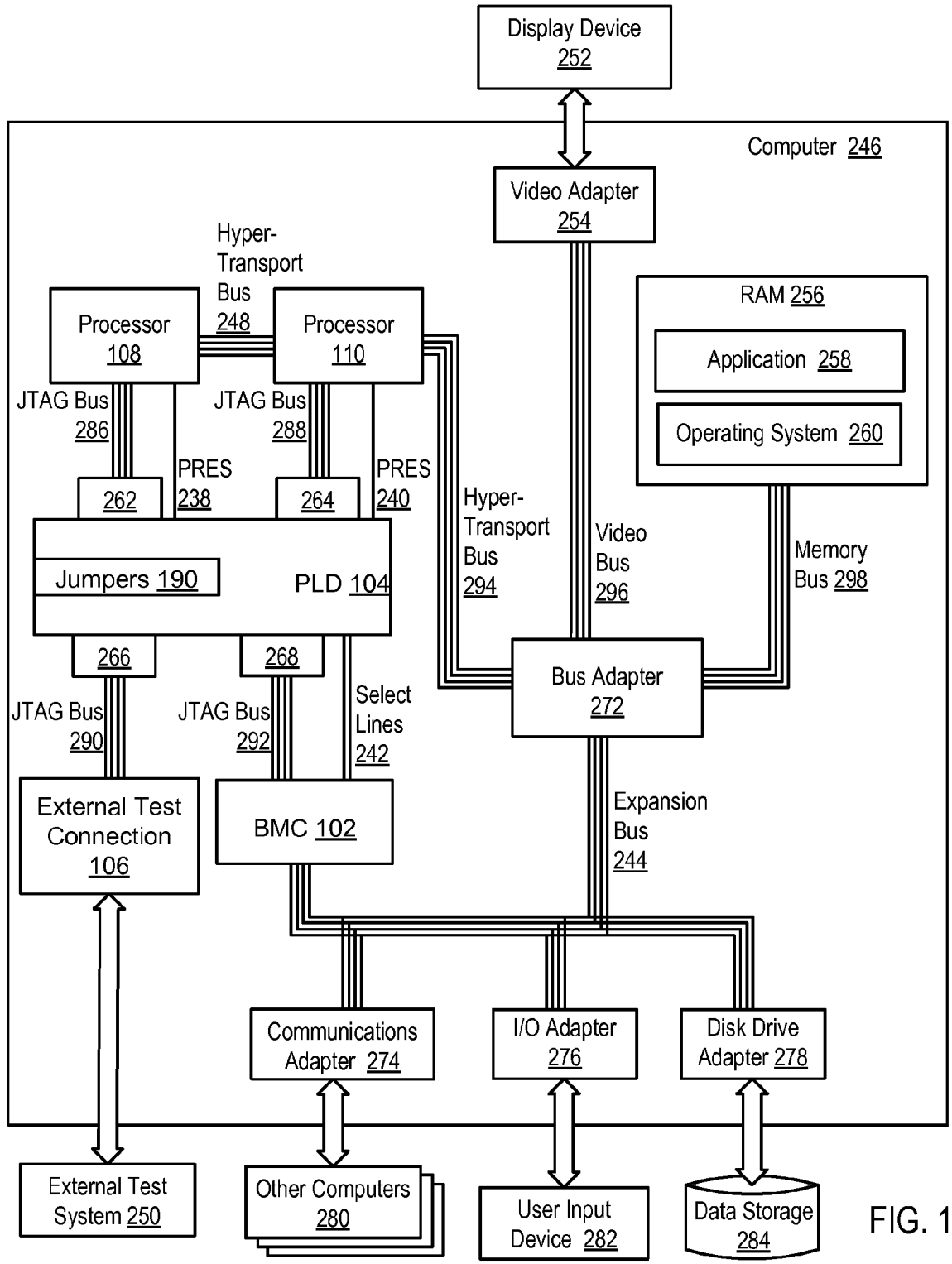
FIG. 1 sets forth a block diagram of an exemplary computer useful for processor fault isolation according to embodiments of the present invention.

FIG. 1 sets forth a block diagram of an exemplary computer (246) useful for processor fault isolation according to embodiments of the present invention. The computer (246) of FIG. 1 includes two computer processors (108, 110) or 'CPUs' as well as random access memory (256) ('RAM') which is connected through a high speed memory bus (296) and bus adapter (272) to the processors (108, 110) and to other components of the computer. The use of two processors (108, 110) in this example is only for convenience of explanation; in fact, computers that carry out processor fault isolation according to embodiments of the present invention can have any number of processors.

The example computer of FIG. 1 includes a programmable logic device ('PLD') that operates according to embodiments of the present invention to multiplex boundary scan signals to a single processor among multiple processors and to connect processors in specified sequences for boundary scan operations. A PLD is an electronic component used to build digital circuits. Unlike a logic gate, which has a fixed function, a PLD has an undefined function at the time of manufacture. Before the PLD can be used in a circuit it must be programmed. Program code for such a PLD may be embodied in a computer program product for processor fault isolation, and the computer program product may be disposed, transported, or transmitted on a signal bearing medium. The signal bearing medium may be a recordable medium such as an optical diskette, a magnetic disk, or a magnetic tape, or the signal bearing medium comprises a transmission medium, such as a computer network or a wireless medium. Examples of PLDs useful in apparatus for processor fault isolation according to embodiments of the present invention include Complex Programmable Logic Devices ('CPLDs'), Field Programmable Gate Arrays ('FPGAs'), Programmable Array Logic ('PAL'), Application Specific Integrated Circuits ('ASICs'), embedded microcontrollers, and others as may occur to those of skill in the art.

The PLD in this example includes several boundary scan ports (262, 264, 266, 268), represented here as JTAG ports. A boundary scan port is a set of boundary scan connections to boundary scan lines that carry boundary scan signals. JTAG signals typically connected through a JTAG port, for example, include TDI (Test Data In), TDO (Test Data Out), TCK (Test Clock), TMS (Test Mode Select), TRST (Test Reset). TRST is an optional signal under JTAG. Because JTAG uses only one data line in each direction, TDI and TDO, JTAG signals are necessarily serial like SPI. The clock input is at the TCK pin. Configuration is performed by manipulating a state machine one bit at a time through a TMS pin. One bit of data is transferred in and out per TCK clock pulse at the TDI and TDO pins, respectively. Different instruction modes can be loaded to read a chip ID, sample input pins, drive (or float) output pins, manipulate chip functions, or BYPASS (pipe TDI to TDO to logically shorten chains of multiple chips).

The PLD (104) in this example provides the capability of dynamic boundary scan test chain configuration and the ability to communicate with a single processor in a virtual chain of processors. For fault isolation purposes, an embedded system microcontroller, represented here by microcontroller BMC (102), manipulates select lines (242) to indicate which processor it wishes to interrogate. The PLD then connects the microcontroller's boundary scan signals (292) to those of the selected processor (108 or 110), in effect creating a boundary scan test chain containing only one processor. By repeating this process, each processor can be interrogated regardless whether any other processor has suffered a catastrophic failure. Also, this process eliminates the need for the microcontroller to any processor's boundary scan port in BYPASS mode, thus reducing the size and complexity of the embedded system microcontroller's (102) control program.

When processor boundary scan is to be used by an external test system (250) for development purposes or manufacturing test, the PLD can use the processor's presence signals (238, 240) to dynamically configure the processor as a boundary scan test chain—if a processor is present, it will be included in the chain. This eliminates the requirement for manual chain reconfiguration based on processor population changes. Override jumpers (190) are provided so that an installed processor, that is, a processor that senses as present, may be excluded from the chain at the behest of a tester. During boundary scan operations by an external test system, the PLD can configure the processors as a single boundary scan chain, based on their population, that is, based on which ones are sensed as present. When a fatal system error occurs, the PLD can break the single chain and await a processor selection from the embedded system microcontroller (102).

In the example computer of FIG. 1, an application program (258), a module of user-level computer program instructions, and an operating system (260) are stored in RAM (256). Operating systems useful in computers that isolate processor faults according to embodiments of the present invention include UNIX™, Linux™, Microsoft NT™, AIX™, IBM's i5/OS™, and others as will occur to those of skill in the art. Operating system (260) and application (258) in the example of FIG. 1 are shown in RAM (256), but many components of such software typically are stored in non-volatile memory also, for example, on a disk drive (284).

The computer (246) of FIG. 1 includes a bus adapter (272), a computer hardware component that contains drive electronics for the high speed buses, the HyperTransport bus (294, 248), the video bus (296), and the memory bus (298), as well as for the slower expansion bus (244). Examples of bus adapters useful in computers that carry out processor fault isolation according to embodiments of the present invention include the Intel Northbridge, the Intel Memory Controller Hub, the Intel Southbridge, the Intel I/O Controller Hub, and Hyper-Transport bus adapters. Examples of expansion buses useful in computers that carry out processor fault isolation according to embodiments of the present invention include Industry Standard Architecture ('ISA') buses and Peripheral Component Interconnect ('PCI') buses.

The HyperTransport bus (294, 248) complies with standards promulgated by The HyperTransport Technology Consortium. The HyperTransport bus (294, 248) is a bidirectional serial/parallel high-bandwidth, low-latency computer bus that is very fast. HyperTransport buses, depending on the version, may run from 200 MHz to 2.6 GHz (compared to PCI at either 33 or 66 MHz). The HyperTransport bus (294, 248) is also a DDR or "Double Data Rate" bus, meaning it sends data on both the rising and falling edges of its bus clock signal. This allows for a maximum data rate of 5200 MTransfers/s per pair running at 2.6 GHz. The primary use for Hyper-Transport, and the way the HyperTransport bus (294, 248) is shown in the example computer of FIG. 1, is to replace the front-side bus, which is currently different for almost every computer. For instance, a Pentium cannot be plugged into a PCI bus. In order to expand the system the front-side bus must connect through adaptors for the various standard buses, like AGP or PCI. These are typically included in the respective controller functions, namely the northbridge and southbridge. A similar computer implemented with HyperTransport is more flexible, as well as being faster. A single PCI<->HyperTransport adaptor chip will work with any HyperTransport enabled microprocessor and allow the use of PCI cards with these processors. For example, the NVIDIA nForce chipset uses HyperTransport to connect its north and south bridges. Because of their speed and flexibility, Hyper-Transport buses are preferred in computers that carry out processor fault isolation according to embodiments of the present invention, but they are not a required element of the present invention. Other buses may be used, including, for example, the well-known shared bus architecture from Intel.

The computer (246) of FIG. 1 includes a disk drive adapter (278) coupled through the expansion bus (244) and the bus adapter (272) to the processors (108, 110) and to other components of the computer (246). The disk drive adapter (278) connects non-volatile data storage to the computer in the form of the disk drive (284). Disk drive adapters useful in computers that carry out processor fault isolation according to embodiments of the present invention include Integrated Drive Electronics ('IDE') adapters, Small Computer System Interface ('SCSI') adapters, and others as will occur to those of skill in the art. In addition magnetic disk drives, non-volatile computer memory may be implemented as an optical disk drive, electrically erasable programmable read-only memory space (so-called 'EEPROM' or 'Flash' memory), battery-supported RAM drives, and so on, as will occur to those of skill in the art.

The example computer of FIG. 1 includes one or more input/output ('I/O') adapters (276). I/O adapters implement user-oriented input/output through, for example, software drivers and computer hardware for controlling output to display devices such as computer display screens, as well as user input from user input devices (282) such as keyboards and mice. The example computer of FIG. 1 includes video adapter (254), which is an example of an I/O adapter specially designed for graphic output to a display device (252) such as a display screen or computer monitor. Video adapter (254) is connected to the processors (108, 110) through a high speed video bus (296), bus adapter (272), and the HyperTransport bus (294, 248), which as noted above is also a high speed bus.

The computer of FIG. 1 includes a communications adapter (274) for data communications with other computers (280). Such data communications may be carried out through serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful in computers that carry out processor fault isolation according to embodiments of the present invention include modems for wired dial-up communications, Ethernet (IEEE 802.3) adapters for wired data communications network communications, and 802.11b/g adapters for wireless data communications network communications.

Figure 2:
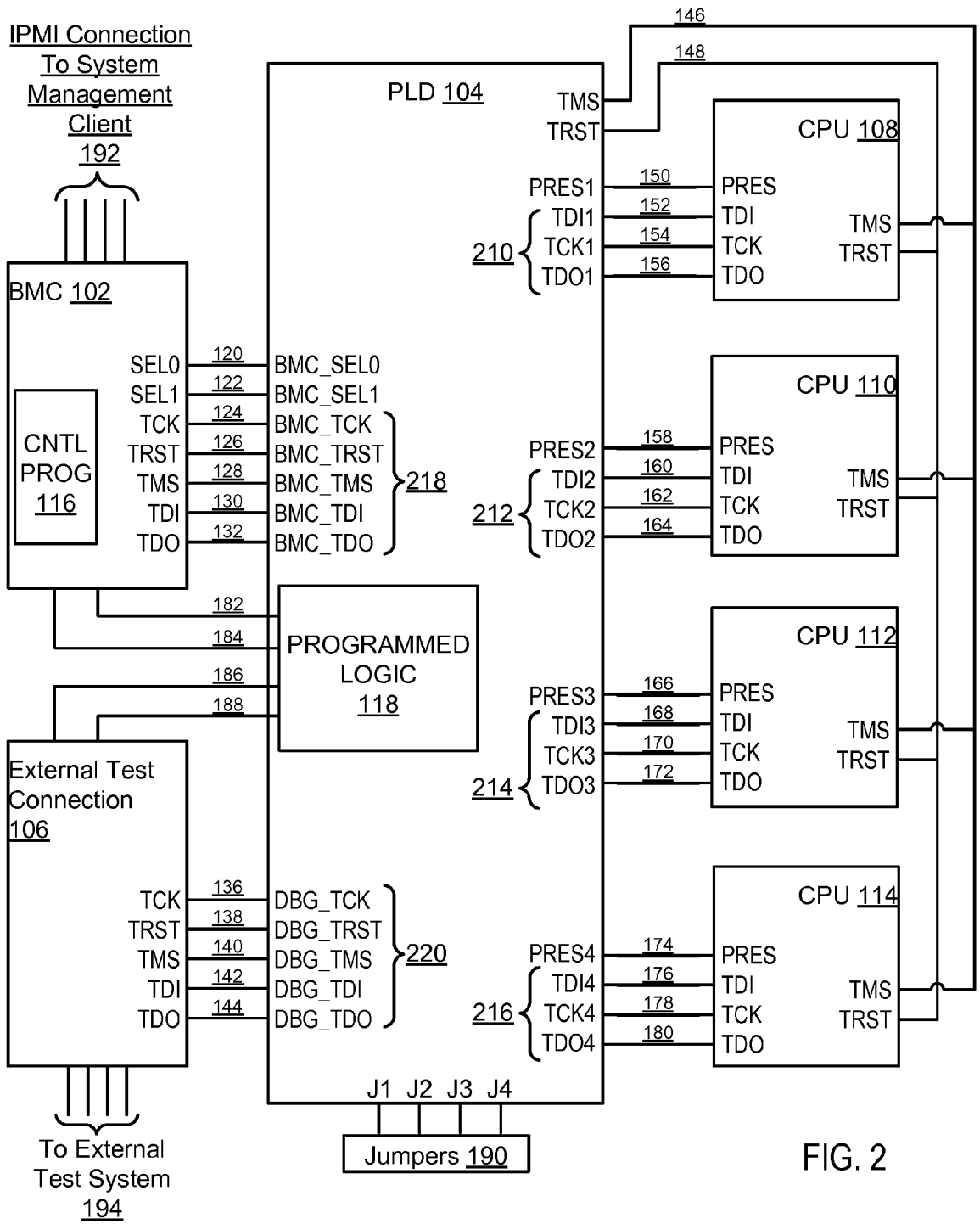
FIG. 2 sets forth a functional block diagram of exemplary apparatus for processor fault isolation according to embodiments of the present invention.

For further explanation, FIG. 2 sets forth a functional block diagram of exemplary apparatus for processor fault isolation according to embodiments of the present invention. FIG. 1 shows physical connections among components of exemplary apparatus for processor fault isolation according to embodiments of the present invention. The apparatus of FIG. 2 include computer components connected for boundary scan operations, in this example, JTAG boundary scan operations. The example apparatus of FIG. 2 includes four computer processors (108, 110, 112, 114) connected by JTAG lines (148-180) to JTAG ports (210, 212, 214, 216) on a PLD (104). The use of four processors in this example is only for convenience of explanation; in fact, computers—or any apparatus—that carry out processor fault isolation according to embodiments of the present invention can have any number of processors.

The apparatus includes an embedded system microcontroller, represented here as a Baseboard Management Controller, BMC (102). The BMC is connected to the PLD (104) by boundary scan lines (124-132), by two processor selection lines (120, 122), and by one or more control lines (182, 184). In this example, the embedded system microcontroller (102) is capable of sending to the PLD (104) selection signal identifying one of the processors for boundary scan operations. The embedded system microcontroller (102) also can send to the PLD boundary scan input signals to be sent to the identified processor.

The PLD (104) in this example is configured by its programmed logic (118) to read and decode an identity of a single processor from the select signals (120, 122) and multiplexing boundary scan input signals received through TDI line (130) to the identified processor and sending to the embedded system microcontroller (102) through TDO line (132) boundary scan output signals returned from the identified processor on any of TDO lines (156, 164, 172, 180). There are discrete pins on the PLD for connection to each processor's TDI, TCK, TDO, and presence ("PRES") signals. The TMS and TRST JTAG signals (16, 148) are bussed among the processors because they can be shared regardless whether boundary scan signals are multiplexed to a single processor or sent to a chain of processors. There are four jumpers (190) connected to the PLD to override an automatic chain configuration based on processor population. The BMC JTAG port (218) and the external test connection JTAG port (220) each has a full set of JTAG signals (TCK, TRST, TMS, TDI, and TDO) connected directly to the PLD. In addition, the BMC has two select signals (120, 122) to select which processor is to be interrogated.

The apparatus of FIG. 2 also includes an access port for an external test system (194), represented here by an external test connection (106). The external test system may be a computer system in itself, running AMD's Hardware Debug Tool, for example, an American Arium, or another external test system as may occur to one of skill in the art.

Figure 3:
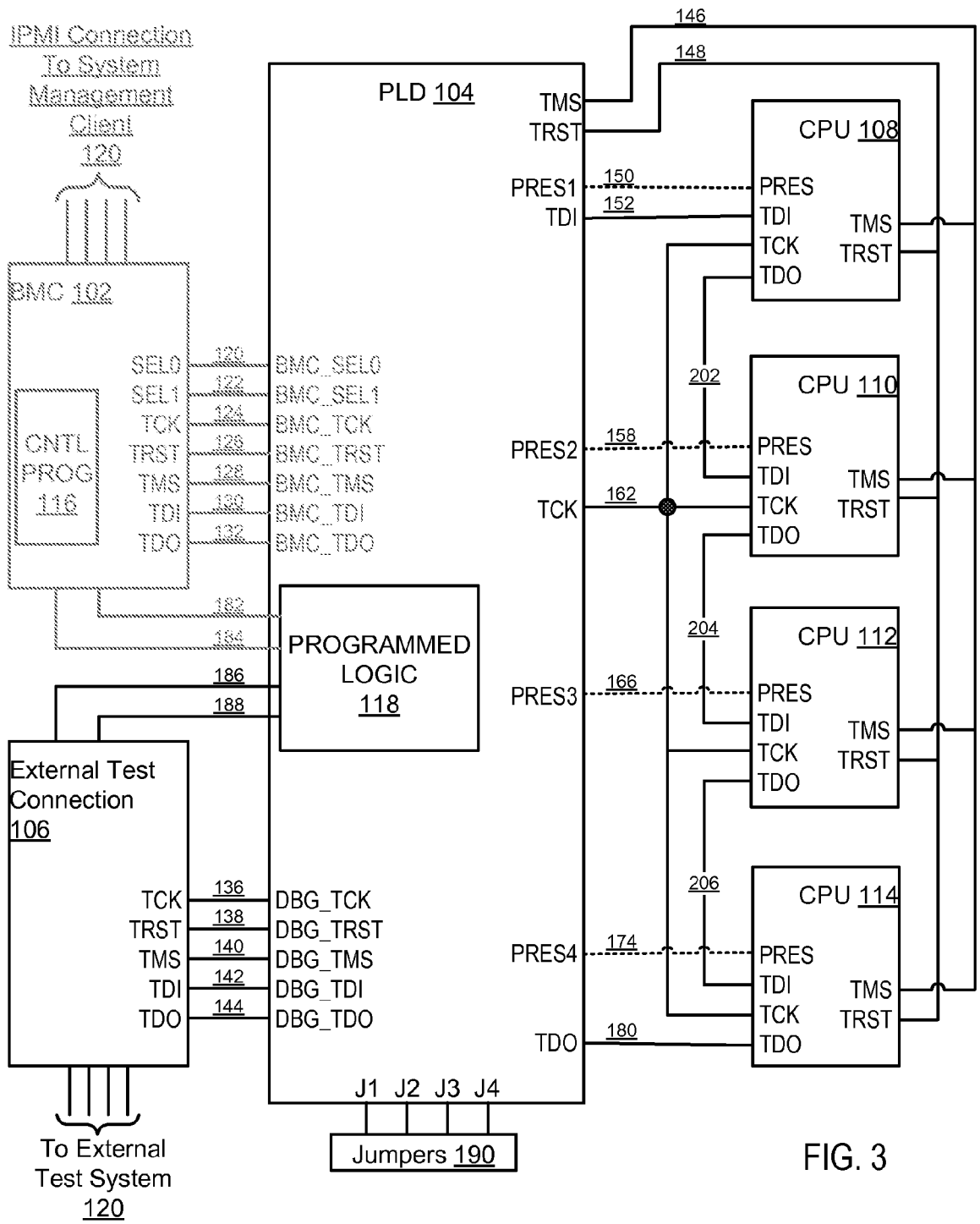
FIG. 3 sets forth a functional block diagram of further exemplary apparatus for processor fault isolation according to embodiments of the present invention.

For further explanation, FIG. 3 sets forth a functional block diagram of further exemplary apparatus for processor fault isolation according to embodiments of the present invention. The apparatus of FIG. 3 has the same physical configuration as the apparatus of FIG. 2. FIG. 3, however, shows the logical connections set up by the PLD (104) under operating conditions appropriate for boundary scan operations with an external test system (120). The BMC (102) and its connections to the PLD (104), although still present, are grayed out to focus on the external test connection (106). In the example of FIG. 3, the processors are configured in a single JTAG chain as required by typical external test systems. This is accomplished by:

- distributing the TCK signal (136, 162) from the external test connection (106) to all processors (108, 110, 112, 114),
- connecting TDI (142) from the external test connection (106) to TDI (152) of the first installed processor (108) in the chain,
- connecting TDO (180) from the last installed processor (114) in the chain to TDO (144) on the external test connection (106), and
- daisy-chaining the TDO's to the TDI's (202, 204, 206) of the remaining installed processors in the system.

All four of these operations are handled internally by the PLD (104). These are logical connections within the PLD carried out according to its programmed logic (118). The physical connections among the components of the apparatus illustrated in FIG. 3 remain as depicted in FIG. 2. The TMS and TRST signals (140, 138) are passed by the PLD (104) from the external test connection (106) to the bussed signals (146, 148) to all processors in the chain. If for some reason an installed processor or processors should be excluded from the chain, a jumper (190) can be installed indicating the position of the processor to be excluded. The processor so indicated can be excluded from the chain by the programmed logic of the PLD.

Figure 4:
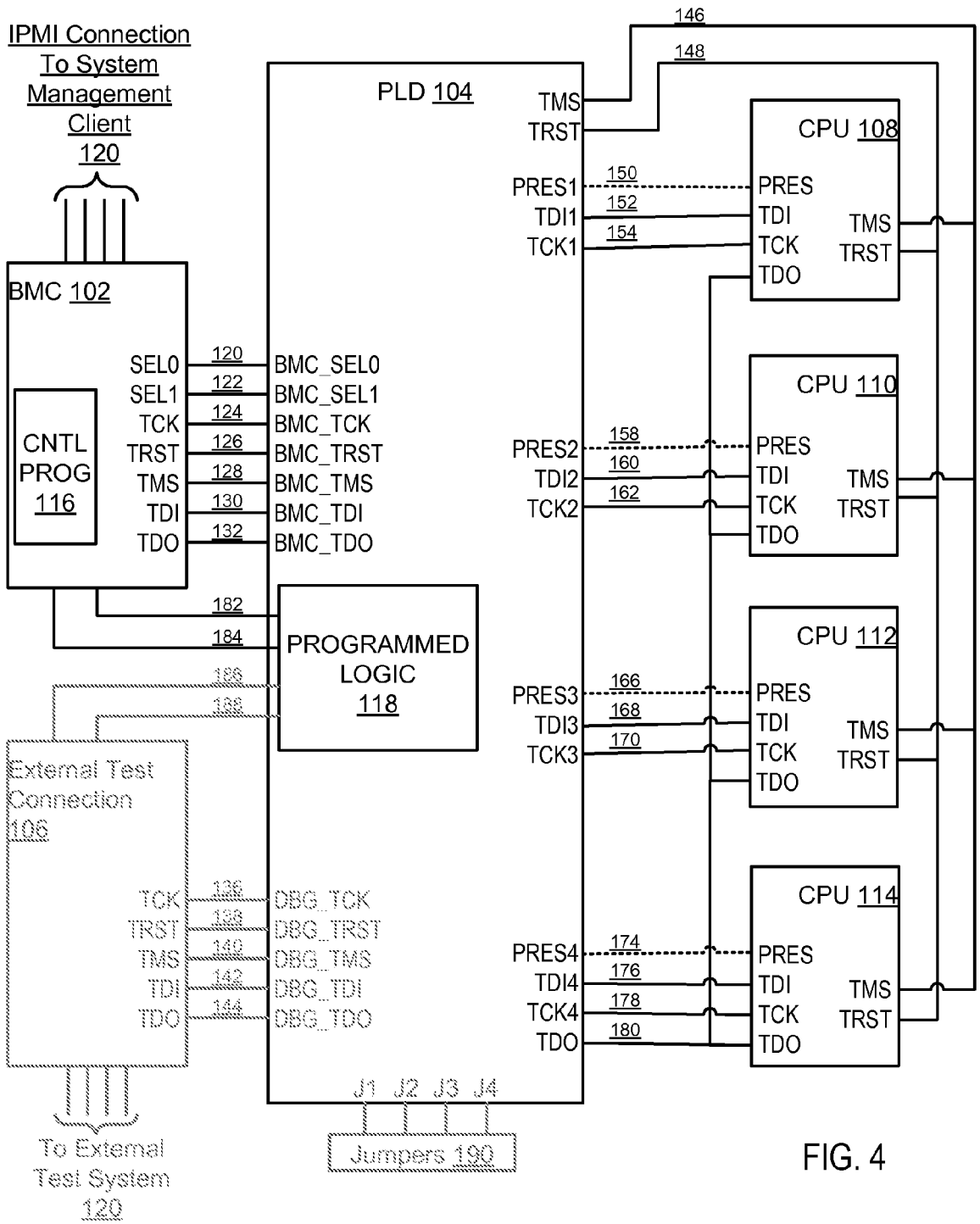
FIG. 4 sets forth a functional block diagram of further exemplary apparatus for processor fault isolation according to embodiments of the present invention.

For further explanation, FIG. 4 sets forth a functional block diagram of further exemplary apparatus for processor fault isolation according to embodiments of the present invention. The apparatus of FIG. 4 has the same physical configuration as the apparatus of FIG. 2. FIG. 4, however, shows the logical connections set up by the PLD (104) under operating conditions appropriate for boundary scan operations with an embedded system microcontroller (102). The external test connection (106) and its connections to the PLD (104), although still present, are grayed out to focus on the embedded system microcontroller (102).

FIG. 4 shows the logical connections set up by the PLD when processor fault isolation by the embedded system microcontroller (102) is desired. When a fatal system error occurs, the PLD (104) will automatically break the boundary scan test chain shown in FIG. 3. When the embedded system microcontroller (102) is ready to start interrogating processors for fault data, it will use the select signals (120, 122) to the PLD to identify a specific processor by, for example, setting the select lines to '00' to select processor number 1, '01' for processor 2, and so on. In response to this, the PLD is programmed to connect the TCK and TDI signals (124, 130) from the embedded system microcontroller (102) to the identified processor. In this configuration, the TDO signals from all the processors can be bussed to a single signal (180, 132) back to the embedded system microcontroller (102). The TMS and TRST signals (128, 126) from the embedded system microcontroller (102) are connected to the bussed signals (146, 148) to all the installed processors (108, 110, 112, 114). In this scenario, the override jumpers (190) will have no effect. The processor presence signals (150, 158, 166, 174) to the PLD can be used by the programmed logic (118) as a safeguard to prohibit the embedded system microcontroller (102) from attempting to communicate with an unpopulated processor slot. By implementing this method, the embedded system microcontroller (102) will only have to deal with a single-processor 'chain' and BYPASS mode can be avoided. Also, if a catastrophic failure has occurred in one processor, the embedded system microcontroller (102) can simply move on and attempt to gather information from other viable processors in the system. If the processors were in a single chain and such a catastrophic failure occurred, no processors could be interrogated because the JTAG chain would rendered completely inoperable.

For further explanation, FIG. 5 sets forth a flow chart illustrating an exemplary method of processor fault isolation according to embodiments of the present invention that includes sending (502), in a computer comprising more than one processor connected for boundary scan operations to a PLD, by an embedded system microcontroller to the PLD at least one selection signal identifying one processor for boundary scan operations. One selection signal can identify one of two processors; two selection signals can identify one of four processors; three selection signals can identify one of eight processors; and so on, for any number of processors and any number of selection signals. The boundary scan operations can be JTAG operations. The embedded system microcontroller can be a Baseboard Management Controller improved according to embodiments of the present application to operate select signals as described above with reference to FIGS. 1-3. In this example, the PLD is a PLD programmed for processor fault isolation and connected to processors, to the embedded system microcontroller, and to an external test connection according to embodiments of the present invention as described above with reference to FIGS. 1-3.

The method of FIG. 5 also includes sending (504), by the embedded system microcontroller to the PLD, boundary scan input signals to be sent to the identified processor. The method of FIG. 5 also includes multiplexing (506) by the PLD the boundary scan input signals to the identified processor. Multiplexing (506) the boundary scan input signals to the identified processor may be carried out by connecting the one identified processor as a boundary scan test chain that includes only the one identified processor. And multiplexing (506) the boundary scan input signals to the identified processor may be carried out by connecting the one identified processor as a boundary scan test chain that includes only the one identified processor without placing any other processor in bypass mode.

The method of FIG. 5 also includes sending (508), by the PLD to the embedded system microcontroller, boundary scan output signals returned from the identified processor. The boundary scan signals, the boundary scan input signals and the output signals, can be JTAG signals.

Figure 6:
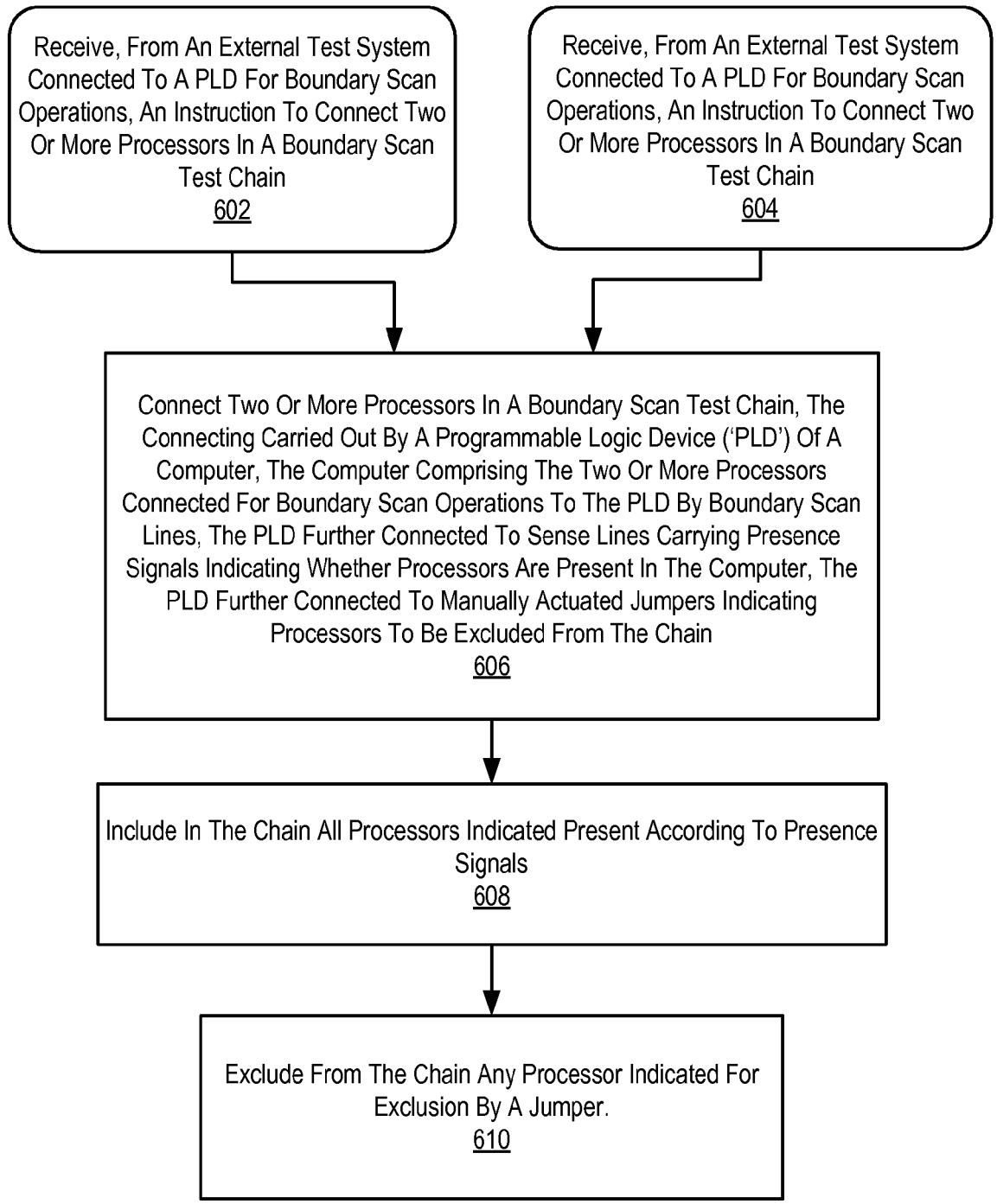
FIG. 6 sets forth a flow chart illustrating a further exemplary method of processor fault isolation according to embodiments of the present invention.

For further explanation, FIG. 6 sets forth a flow chart illustrating a further exemplary method of processor fault isolation according to embodiments of the present invention that includes connecting (606) two or more processors in a boundary scan test chain. The connecting is carried out by a PLD of a computer. The computer includes the two or more processors connected for boundary scan operations to the PLD by boundary scan lines, and the PLD is further connected to sense lines carrying presence signals indicating whether processors are present in the computer. The boundary scan operations can be JTAG operations. The embedded system microcontroller can be a Baseboard Management Controller improved according to embodiments of the present application to operate select signals as described above with reference to FIGS. 1-3. In this example, the PLD is a PLD programmed for processor fault isolation and connected to processors, to the embedded system microcontroller, and to an external test connection according to embodiments of the present invention as described above with reference to FIGS. 1-3.

The method of FIG. 6 also includes including (608) in the chain all processors indicated present according to presence signals. In the method of FIG. 6, the PLD is connected to manually actuated jumpers indicating processors to be excluded from the chain, and the method also includes excluding (610) from the chain any processor indicated for exclusion by a jumper. The jumper is part of a set of manually actuated connections, a plug set, a jumper switch, a soldered wireline connection, and so on, as will occur to those of skill in the art.

The method of FIG. 6 also includes an additional, alternative step of receiving (602), from an external test system connected to the PLD for boundary scan operations, an instruction to connect two or more of the processors in a boundary scan test chain. When such an instruction is received from an external test system, then connecting (606) two or more of the processors in a boundary scan test chain is carried out in response to receiving the instruction.

The method of FIG. 6 also includes an additional, alternative step of receiving (604), from an embedded system microcontroller connected to a PLD for boundary scan operations, an instruction to connect two or more processors in a boundary scan test chain. When such an instruction is received from an embedded system microcontroller, then connecting (606) two or more of the processors in a boundary scan test chain is carried out in response to receiving the instruction.

In effect, the PLD is modal, having one mode that multiplexes boundary scan signals to a single processor and another mode that connect processors into a boundary scan chain that includes multiple processors. The PLD can detect the need for a mode change, as when a complete failure of boundary scan in the chained mode indicates a need to change to multiplex mode and await a processor selection from an embedded system microcontroller. Or the PLD can accept from an embedded system microcontroller or from an external test system an instruction to change modes—thus giving a system administrator or a test user the ability to decide whether to multiplex signals to a particular processor or connect all present and non-excluded processors into a single scan chain. Excluding processors from a scan chain with a jumper gives test users and system administrators the ability to exclude from a scan chain a processor known to be faulty, such as, for example, a processor that has failed so completely that it no longer responds to boundary scan.

In view of the explanations set forth above in this specification, readers will recognize that carrying out processor fault isolation according to embodiments of the present invention provides the following benefits:

Processors can still be scanned for failures even if one of them has a failing JTAG port that would render a chained JTAG solution inoperable;

The PLD can reconfigure the processors into any chain configuration as may be required by a system administrator through an embedded system microcontroller or by a test user through an external test system such as AMD's HDT.

Allows an embedded system microcontroller such as a Baseboard Management Controller with limited resources to manipulate boundary scan ports using less code and memory resources due to dramatically reduced length of boundary scan data, reduced size of scan chains, and reduced requirement for BYPASS mode in scan chains.

Exemplary embodiments of the present invention are described largely in the context of a fully functional computer system for processor fault isolation. Readers of skill in the art will recognize, however, that the present invention also may be embodied in a computer program product disposed on signal bearing media for use with any suitable data processing system. Such signal bearing media may be transmission media or recordable media for machine-readable information, including magnetic media, optical media, or other suitable media. Examples of recordable media include magnetic disks in hard drives or diskettes, compact disks for optical drives, magnetic tape, and others as will occur to those of skill in the art. Examples of transmission media include telephone networks for voice communications and digital data communications networks such as, for example, Ethernets™ and networks that communicate with the Internet Protocol and the World Wide Web. Persons skilled in the art will immediately recognize that any computer system having suitable programming means will be capable of executing the steps of the method of the invention as embodied in a program product. Persons skilled in the art will recognize immediately that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for processor fault isolation, the method comprising:
   sending, in a computer comprising more than one processor connected for boundary scan operations to a programmable logic device ('PLD'), by an embedded system microcontroller to the PLD at least one selection signal identifying one processor for boundary scan operations; and
   sending, by the embedded system microcontroller to the PLD, boundary scan input signals to be sent to the identified processor;
   multiplexing by the PLD the boundary scan input signals to the identified processor; and
   sending, by the PLD to the embedded system microcontroller, boundary scan output signals returned from the identified processor.

2. The method of claim 1 wherein multiplexing the boundary scan input signals to the identified processor further comprises connecting the one identified processor as a boundary scan test chain comprising only the one identified processor.

3. The method of claim 1 wherein multiplexing the boundary scan input signals to the identified processor further comprises connecting the one identified processor as a boundary scan test chain comprising only the one identified processor without placing any other processor in bypass mode.

4. The method of claim 1 wherein the boundary scan operations are JTAG operations, and the boundary scan signals are JTAG signals.

5. The method of claim 1 wherein the embedded system microcontroller is a Baseboard Management Controller.

6. A method for processor fault isolation, the method comprising:
   connecting two or more processors in a boundary scan test chain, the connecting carried out by a programmable logic device ('PLD') of a computer, the computer comprising the two or more processors connected for boundary scan operations to the PLD by boundary scan lines, the PLD further connected to sense lines carrying presence signals indicating whether processors are present in the computer; and
   including in the chain all processors indicated present according to presence signals.

7. The method of claim 6 wherein:
   the PLD is further connected to manually actuated jumpers indicating processors to be excluded from the chain; and
   the method further comprises excluding from the chain any processor indicated for exclusion by a jumper.

8. The method of claim 7 wherein the embedded system microcontroller is a Baseboard Management Controller.

9. The method of claim 6 further comprising:
   receiving, from an external test system connected to the PLD for boundary scan operations, an instruction to connect two or more of the processors in a boundary scan test chain;
   wherein connecting two or more of the processors in a boundary scan test chain is carried out in response to receiving the instruction.

10. The method of claim 6 further comprising:
    receiving, from an embedded system microcontroller connected to the PLD for boundary scan operations, an instruction to connect two or more of the processors in a boundary scan test chain;
    wherein connecting two or more of the processors in a boundary scan test chain is carried out in response to receiving the instruction.

11. The method of claim 6 wherein the boundary scan operations are JTAG operations.

12. An apparatus for processor fault isolation, the apparatus comprising:
    a computer comprising two or more computer processors;
    the computer further comprising an embedded system microcontroller connected to a programmable logic device ('PLD') by boundary scan lines, by one or more processor selection lines, and optionally by one or more control lines, the embedded system microcontroller capable of sending to the PLD at least one selection signal identifying one processor for boundary scan operations and capable of sending to the PLD boundary scan input signals to be sent to the identified processor; and
    the computer further comprising the PLD connected to the computer processors for boundary scan operations through boundary scan lines, the PLD capable of multiplexing the boundary scan input signals to the identified processor sending to the embedded system microcontroller boundary scan output signals returned from the identified processor.

13. The apparatus of claim 12 wherein multiplexing the boundary scan input signals to the identified processor further comprises connecting the one identified processor as a boundary scan test chain comprising only the one identified processor.

14. The apparatus of claim 12 wherein multiplexing the boundary scan input signals to the identified processor further comprises connecting the one identified processor as a boundary scan test chain comprising only the one identified processor without placing any other processor in bypass mode.

15. The apparatus of claim 12 further comprising an external test system outside the computer, the external test system connected to the PLD for boundary scan operations, the PLD further connected to sense lines carrying presence signals indicating whether processors are present in the computer, the PLD further capable of:

connecting two or more of the processors in a boundary scan test chain; and including in the chain all processors indicated present according to presence signals.

16. The apparatus of claim 15 wherein:

the PLD is further connected to manually actuated jumpers indicating processors to be excluded from the chain; and the PLD is further capable of excluding from the chain any processor indicated for exclusion by a jumper.

17. The apparatus of claim 12 wherein the PLD is further capable of:

receiving from the external test system an instruction to connect two or more of the processors in a boundary scan test chain; and carrying out the connecting of two or more of the processors in a boundary scan test chain in response to receiving the instruction.

18. The apparatus of claim 12 further wherein the PLD is further capable of:

receiving from the embedded system microcontroller an instruction to connect two or more of the processors in a boundary scan test chain; and carrying out the connecting of two or more of the processors in a boundary scan test chain in response to receiving the instruction.

19. The apparatus of claim 12 wherein the embedded system microcontroller is a Baseboard Management Controller.

20. The apparatus of claim 12 wherein the boundary scan operations are JTAG operations and the boundary scan signals are JTAG signals.

* * * * *